(12) United States Patent
Aoki

(10) Patent No.: US 6,624,061 B2
(45) Date of Patent: *Sep. 23, 2003

(54) SEMICONDUCTOR DEVICE AND METHOD OF MANUFACTURING THE SAME CAPABLE OF REDUCING DETERIORATION OF LOW DIELECTRIC CONSTANT FILM

(75) Inventor: Hidemitsu Aoki, Tokyo (JP)

(73) Assignee: NEC Electronics Corporation, Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/311,999

(22) Filed: May 14, 1999

(65) Prior Publication Data
US 2002/0066941 A1 Jun. 6, 2002

(30) Foreign Application Priority Data
May 28, 1998 (JP) .......................................... 10-146998

(51) Int. Cl.[7] .......................................... H01L 21/4763
(52) U.S. Cl. ........................ 438/622; 438/623; 438/624; 438/625; 438/618; 438/637
(58) Field of Search ................................ 438/589, 594, 438/618, 622–625, 637

(56) References Cited

U.S. PATENT DOCUMENTS 6,043,145 A * 3/2000 Suzuki et al. ............... 438/622
6,100,183 A * 8/2000 Lu et al. ..................... 438/637

FOREIGN PATENT DOCUMENTS

| JP | 01-150342 | 6/1989 |
| JP | 02-142162 | 5/1990 |
| JP | 03-104260 | 5/1991 |
| JP | 4-68531 | 3/1992 |
| JP | 05-243388 | 8/1993 |
| JP | 06-005711 | 1/1994 |
| JP | 07/335758 | 12/1995 |
| JP | 09-063989 | 3/1997 |

* cited by examiner

Primary Examiner—Phat X. Cao
Assistant Examiner—Thao X. Le
(74) Attorney, Agent, or Firm—Scully, Scott Murphy & Presser

(57) ABSTRACT

In a semiconductor device, a wiring line layer is formed on a substrate. A dielectric constant film is formed on the wiring line layer. An upper protection film is formed on an entire portion of the dielectric constant film. An opening portion is formed through the upper protection film and the dielectric constant film to the wiring line layer. A conductor buried portion formed into the opening portion. The dielectric constant film has a smaller dielectric constant value than those of a silicon oxide film and silicon nitride film. Also, a side protection film may be formed on all side portions of the opening portion.

11 Claims, 5 Drawing Sheets

SEMICONDUCTOR DEVICE AND METHOD OF MANUFACTURING THE SAME CAPABLE OF REDUCING DETERIORATION OF LOW DIELECTRIC CONSTANT FILM

BACKGROUND OF THE INVENTION

1. Field of the Invention

The present invention relates to a semiconductor device having a low dielectric constant film, and a method of manufacturing a semiconductor device with the low dielectric constant film. More specially, the present invention relates to a semiconductor device having a through hole and/or a groove (trench) while reducing deterioration of a low dielectric constant film in the manufacturing stage, and also to a method for manufacturing the semiconductor device having a low dielectric constant film. The through hole is employed to connect electrically wiring lines/patterns formed on and under the low dielectric constant film respectively. The groove is used to embed or bury the wiring lines/patterns into the low dielectric constant film.

2. Description of the Related Art

In general, electronic devices with using semiconductors require high-speed operations. More specifically, high-speed operation requirements are highly emphasized in logic devices.

Conventionally, as methods capable of operating semiconductor devices in high speeds, operating speeds of transistors are increased. On the other hand, while semiconductor devices are manufactured by realizing very fine structures, delays occurred in signals propagated through wiring lines/patterns would cause a serious problem, rather than delays occurred in signals due to parasitic capacitances of transistors.

In general, lengths of wiring lines employed in logic devices are made long. Under such a circumstance, it is usually required to suppress delays of signals propagated through wiring lines.

A speed of a signal propagated through a wiring line may be defined by multiplying a wiring line resistance (R) by a capacitance between wiring lines (C), namely a product (R×C). When the value of this product (R×C) is small, the speed of the signal propagated through the wiring line becomes fast, whereas when the value of this product (R×C) is large, the speed of the signal propagated through the wiring line becomes delay.

To suppress a delay contained in a signal propagation speed, al least one of a wiring line resistance (R) and a capacitance (C) between wiring lines is required to be reduced. Conventionally, aluminum wiring lines have been employed to reduce wiring resistances (R). Recently, copper wiring lines having a lower resistance than that of aluminum wiring lines are examined to be used for the same purpose. On the other hand, conventionally, silicon oxide films and silicon nitride films are examined to be employed to form interlayer films for reducing capacitance (C) between wiring lines. Recently, various sorts of low dielectric constant films are examined to be used. These low dielectric constant films are made of either organic materials or inorganic materials, the dielectric constant of which is lower than that of the silicon oxide film, or silicon nitride film.

Very recently, as the low dielectric constant films capable of reducing the capacitance (C) between wiring lines, an HSQ (hydrogen silsesquioxane) film corresponding to an inorganic coating film is desirably employed.

When a low dielectric constant film is formed in a semiconductor device having a multi-layer wiring structure, a plug is necessarily formed to connect wiring lines (patterns) electrically formed on an upper layer and a lower layer of this low dielectric constant film. To this end, a through hole must be formed in the low dielectric constant film.

FIGS. 1A, 1B, and 1C are section views of schematically indicating one conventional forming step for forming a through hole in a low dielectric constant film.

First, as shown in FIG. 1A, a silicon oxide film 302 is formed on a semiconductor substrate 301. Subsequently, a silicon nitride film 303 is formed on this silicon oxide film. Next, an aluminum wiring line (pattern) 304 functioning as a lower-layer (under-layer) wiring line is formed in a groove (trench) which is formed in both the silicon oxide film 302 and the silicon nitride film 303. Thereafter, an HSQ (hydrogen silsesquioxane) film 305 functioning as an interlayer insulating film is formed on the entire portions of the silicon nitride film 303 and the aluminum wiring line 304. Next, a resist mask 306 is formed on this HSQ film 305. A dry etching treatment with this resist mask 306 is carried out for the HSQ film 305 to form a through hole 315 in this HSQ film 305. At this time, the over etching treatment is sufficiently performed to expose completely the aluminum wiring line 304 formed on the bottom portion of the through hole 315. As a result of the above manufacturing steps, the semiconductor structure shown as the section view of FIG. 1A is obtained.

There are many possibilities that the over-etched amount obtained by the above-described over-etching treatment becomes more than, or equal to 100 percents. At this time, a large number of deposited articles 311 made of aluminum compound are formed inside the through hole 315. This condition is illustratively shown as the section view of FIG. 1B.

Next, the resist mask 306 is stripped by employing oxygen plasma. Also, the deposited articles 311 formed inside the through hole 315 are removed by using organic solvent. Usually, the following organic solvent used in this removing process operation is used to remove the deposited articles 311 without melting metal aluminum, that is to say, solvent containing amine such as hidroxylamine. Thereafter, a conductive material made of copper is embedded within this through hole 315 to form a plug 307. As a result of the above manufacturing steps, the semiconductor structure shown as the section view of FIG. 1C is obtained.

The silicon nitride film 303 formed on the lower layer of the HSQ film 305 may function as the etching stopper to the silicon oxide film 302 formed on the lower layer when a misalignment is produced to the aluminum wiring line 304 in the step of forming the through hole 315. As a result, the silicon nitride film 303 can be used to prevent the silicon oxide film 302 from being etched away.

Although the above-described manufacturing steps are directed to forming of the plug 307 in the HSQ film 305, similar manufacturing steps may be applied when the groove wiring line is formed in the HSQ film 305. In particular, when the wiring line is made of copper, since the dry etching treatment can be hardly executed for the copper film, this groove wiring line may be used.

This HSQ film 305 is readily deteriorated in the case that this HSQ film 305 is reacted with the oxygen plasma or the organic solvent. Also as indicated in the above-explained manufacturing steps, the resist mask 306 is stripped by using the oxygen plasma, and the deposited articles 311 formed inside the through hole 315 are removed by using the organic solvent. While the above-described stripping process operation as well as removing process operation is carried out, since both the oxygen plasma and the organic solvent may give adverse influences to the surface of the HSQ film 305. As a result, an HSQ damaged portion 312 is produced on this surface of the HSQ film 305, and this HSQ film 305 would be deteriorated.

A concrete explanation will now be made of deterioration reaction of the above-explained HSQ film 305.

First, an HSQ film owns an Si—H coupling. This Si—H coupling is changed into an Si—OH coupling when the HSQ film reacts with oxygen plasma and organic solvent. As a result, the HSQ film will be changed into such a film having a moisture absorption characteristic. In such a case that the HSQ film contains water, a leak amount of a current in the plug 307 and the groove wiring line will be increased, and also a dielectric constant owned by this HSQ film is increased. Furthermore, since the HSQ film can readily absorb water, this water may corrode the metal copper and the metal aluminum, which are made in contact with this HSQ film. As a result, there are possibilities that the circuit performance would be lowered and also the circuit malfunction would be induced.

The above-described problems about the deterioration reaction of the HSQ film 305 may be similarly applied to another case. That is, instead of this HSQ film 305, an inorganic SOG (spin on glass) coating film having another low dielectric constant is employed as the low dielectric constant film. Similarly, this deterioration reaction problem may occur when a certain sort of organic SOG films is employed as this low dielectric constant film instead of the HSQ film 305.

The following conventional semiconductor device manufacturing methods related to forming of the through holes have been proposed as conventional examples.

First, Japanese Laid-open Patent Application (JP-A-Heisei 6-5711) describes "SEMICONDUCTOR DEVICE MANUFACTURING METHOD". In this manufacturing method, first, the opening portion is formed in the interlayer insulating layer. When, the side wall made of the insulating film is formed on this opening portion, the following restriction can be avoided. That is, the size of the under-layer wiring line is restricted by the size of this opening portion. This under-layer wiring line is connected via this opening portion to the upper-layer wiring line, and is located at the under layer of this opening portion.

Japanese Laid-open Patent Application (JP-A-Heisei 9-63989) describes "SEMICONDUCTOR DEVICE". As the method for opening the contact hole in the multi-layer insulating film made of more than 2 sorts of insulating films, when the wet etching treatment is employed, neither the concave portion, nor the convex portion is formed on the side surface of the contact hole.

Also, Japanese Laid-open Patent Application (JP-A-Heisei 7-335758) describes "METHOD FOR FORMING MULTILAYER METAL WIRING LINE". This conventional forming method corresponds to the multi-layer metal wiring line forming method capable of preventing the interlayer insulating film from being moisture-absorbed. Concretely speaking, this multi-layer metal wiring line forming method is composed of a following set of steps. A step for forming the under-layer metal wiring line in a portion of the multi-layer metal wiring line. And a step for forming the oxide silicon film as the first interlayer insulating film on this under-layer metal wiring line. And a step for forming the insulating film having a higher moisture absorption characteristic and made of the SOG film as the second interlayer insulating film on this first interlayer insulating film. And a step for forming the molecular layer having a hydrophobic property on this second interlayer insulating film. And a step for forming the silicon oxide film as the third interlayer insulating film on this molecular layer. And a step for etching the first interlayer insulating film, the second interlayer insulating film, the molecular layer, and the third interlayer insulating film to form desirable shapes thereof. And also a step for forming the upper-layer metal wiring line while covering the entire multi-layer metal wiring line.

SUMMARY OF THE INVENTION

The present invention is accomplished to solve the above-mentioned problems.

Therefore, an object of the present invention is to provide a semiconductor device and a manufacturing method for the same, in which the semiconductor device can be prevented from deterioration of a low dielectric constant film.

Another object of the present invention is to provide a semiconductor device and a manufacturing method for the same, in which the semiconductor device can be prevented from deterioration of a low dielectric constant film when a plug is formed in the low dielectric constant film.

Still another object of the present invention is to provide a semiconductor device and a manufacturing method for the same, in which the semiconductor device can be prevented from deterioration of a low dielectric constant film when a wiring line groove is formed in the low dielectric constant film.

In order to achieve an aspect of the present invention, a semiconductor device includes a wiring line layer formed on a substrate, a dielectric constant film formed on the wiring line layer, an upper protection film formed on an entire portion of the dielectric constant film, an opening portion formed through the upper protection film and the dielectric constant film to the wiring line layer, and a conductor buried portion formed into the opening portion. Here, the dielectric constant film has a smaller dielectric constant value than those of a silicon oxide film and silicon nitride film.

The semiconductor device may further include a side protection film formed on all side portions of the opening portion.

In the semiconductor device, an uppermost layer of the wiring layer may includes an insulating portion made of insulating materials, and an electrically conductive portion made of electrically conductive materials. Here, at least a part of the electrically conductive portion is exposed by the opening portion.

In the semiconductor device, the conductor buried portion may be made of material selected from the group consisting of tungsten, aluminum, and copper.

In the semiconductor device, the dielectric constant film may be made of material selected from the group consisting of HSQ, xerogel, hydrogen organo siloxane polymer, methyl silsesquixane, poly-tetra-fluoroethylene, fluorinated poly-aryl-ether, poly-para-xylylene, and benzo cyclobutene, and silicon low K polymer.

In the semiconductor device, the upper protection film may be made of silicon nitride.

In the semiconductor device, the side protection film may be made of silicon oxide.

In the semiconductor device, the insulating portion may be made of silicon nitride.

In order to achieve another aspect of the present invention, a method of manufacturing a semiconductor device includes a set of steps of forming a dielectric constant film on a wiring line layer formed on a substrate, forming an upper protection film made of silicon nitride on the dielectric constant film, forming an opening portion through the upper protection film and the dielectric constant film to the wiring line layer by selectively etching the dielectric constant film, and burying an electrically conductive material into the opening portion to form a conductor buried portion. Here, the dielectric constant film has a smaller dielectric constant value than those of a silicon oxide film and silicon nitride film. Also, the upper protection film may function as an etching mask.

The method of manufacturing a semiconductor device may further include a step of forming a side protection film on all sides of the dielectric constant film exposed at the opening portion.

In the method of manufacturing a semiconductor device, the opening portion may include a hole for forming a contact plug and/or a groove for forming a wiring line.

In the method of manufacturing a semiconductor device, an uppermost layer of the wiring layer may include an insulating portion made of silicon nitride and an electrically conductive portion made of electrically conductive materials. Also, the step of forming the opening portion may be controlled to form the opening portion through the upper protection film and the dielectric constant film to at least a part of the electrically conductive portion.

In the method of manufacturing a semiconductor device, the electrically conductive portion may include a metal wiring line and/or a contact plug.

In the method of manufacturing a semiconductor device, the step of burying the electrically conductive material may include a step of burying the electrically conductive material into the opening portion. Also, the side protection film may be formed on the all sides of the opening portion.

In the method of manufacturing a semiconductor device, the step of forming the upper protection film may include a set of steps of forming a silicon nitride film on an entire portion of the dielectric constant film, forming a resist mask on the silicon nitride film, and selectively etching the silicon nitride film using the resist mask.

In the method of manufacturing a semiconductor device, the step of forming an opening portion may further include a step of controlling an etching amount to the dielectric constant film such that the wiring line layer is not reacted with etching gas. Also, the step of forming a side protection film may include a set of steps of forming a covering oxide film covering an entire semiconductor structure containing the opening portion, anisotropically etching the covering oxide film to the wiring line layer located at a lower portion of the opening portion until the wiring line layer is exposed.

In the method of manufacturing a semiconductor device, an uppermost layer of the wiring layer may include an insulating portion made of a silicon nitride film, and an electrically conductive portion made of electrically conductive materials. Also, at least a part of the electrically conductive portion may be exposed at a bottom of the opening portion before the step of burying an electrically conductive material. Moreover, the step of forming the side protection film may further include a step of removing a reacted article produced by reacting with the exposed wiring line layer and the etching gas used in the step of anisotropically etching the covering oxide film before the step of burying an electrically conductive material.

In the method of manufacturing a semiconductor device, the step of removing the reacted article may include a step of cleaning the opening portion with organic solvent.

In the method of manufacturing a semiconductor device, the organic solvent may contain amine.

In the method of manufacturing a semiconductor device, the organic solvent may contain material selected from the group consisting of hydroxylamine, mono-ethanolamine, and N-methyle ethanolamine.

In the method of manufacturing a semiconductor device, the step of forming the covering oxide film may include a step of forming a silicon oxide film by a CVD (chemical vapor deposition) method to cover an entire semiconductor structure containing the opening portion.

In the method of manufacturing a semiconductor device, a film thickness of the covering oxide film may be substantially 30 to 40 nm.

In the method of manufacturing a semiconductor device, the conductor buried portion may be made of material selected from the group consisting of tungsten, aluminum, and copper.

In the method of manufacturing a semiconductor device, the electrically conductive portion may be made of material selected from the group consisting of tungsten, aluminum, and copper.

In the method of manufacturing a semiconductor device, the step of forming an opening portion includes the step of selectively etching the dielectric constant film with an etching gas. And the etching gas may be made of material selected from the group consisting of carbon/fluorine mixed gas, carbon/fluorine-mixture-gas mixed with hydrogen gas, carbon/fluorine-mixture-gas mixed with argon gas, and carbon-fluorine-mixture gas mixed with both hydrogen gas and argon gas.

In the method of manufacturing a semiconductor device, a film thickness of the upper protection film may be thicker than a $1/10$ film thickness of the dielectric constant film.

In the method of manufacturing a semiconductor device, the dielectric constant film may be made of material selected from the group consisting of HSQ, xerogel, hydrogen organo siloxane polymer, methyl silsesquixane, poly-tetrafluoroethylene, fluorinated poly-aryl-ether, poly-para-xylylene, and benzo cyclobutene, and silicon low K polymer.

In order to achieve still another aspect of the present invention, a method of manufacturing a semiconductor device includes a set of steps of forming a dielectric constant film on a wiring line layer formed on a substrate, forming an opening portion through the dielectric constant film to the wiring line layer, forming a side protection film on all sides of the dielectric constant film exposed at the opening portion, and burying an electrically conductive material into the opening portion to form a conductive buried layer. Here, the dielectric constant film has a smaller dielectric constant value than those of a silicon oxide film and silicon nitride film. Also, an uppermost layer of the wiring line layer includes an insulating portion and an electrically conductive portion. Moreover, at least a part of the electrically conductive portion is exposed at the bottom of the opening portion.

The method of manufacturing a semiconductor device may further include a step of forming an upper surface protection layer on an entire upper surface of the dielectric constant film.

In the method of manufacturing a semiconductor device, the step of forming a side protection film may include a set of steps of forming a silicon oxide film by a chemical vapor deposition method to cover an entire semiconductor structure containing the opening portion, and anisotropically etching the silicon oxide film until the wiring line layer located at a lower portion of the opening portion is exposed.

In the method of manufacturing a semiconductor device, the organic solvent may contain amine.

In the method of manufacturing a semiconductor device, the organic solvent may contain material selected from the group consisting of hydroxylamine, mono-ethanolamine, and N-methyle ethanolamine.

In the method of manufacturing a semiconductor device, a film thickness of the covering oxide film may be substantially 30 to 40 nm.

In the method of manufacturing a semiconductor device, the electrically conductive material may be made of material selected from the group consisting of tungsten, aluminum, and copper.

In the method of manufacturing a semiconductor device, the step of forming an opening portion may include the step of selectively etching the dielectric constant film with an etching gas, and the etching gas is made of material selected from the group consisting of carbon/fluorine mixed gas, carbon/fluorine-mixture-gas mixed with hydrogen gas, carbon/fluorine-mixture-gas mixed with argon gas, and carbon-fluorine-mixture gas mixed with both hydrogen gas and argon gas.

In the method of manufacturing a semiconductor device, the dielectric constant film may be made of material selected from the group consisting of HSQ, xerogel, hydrogen organo siloxane polymer, methyl silsesquixane, poly-tetra-fluoroethylene, fluorinated poly-aryl-ether, poly-para-xylylene, and benzo cyclobutene, and silicon low K polymer.

DESCRIPTION OF THE PREFERRED EMBODIMENTS

Figure 1A:
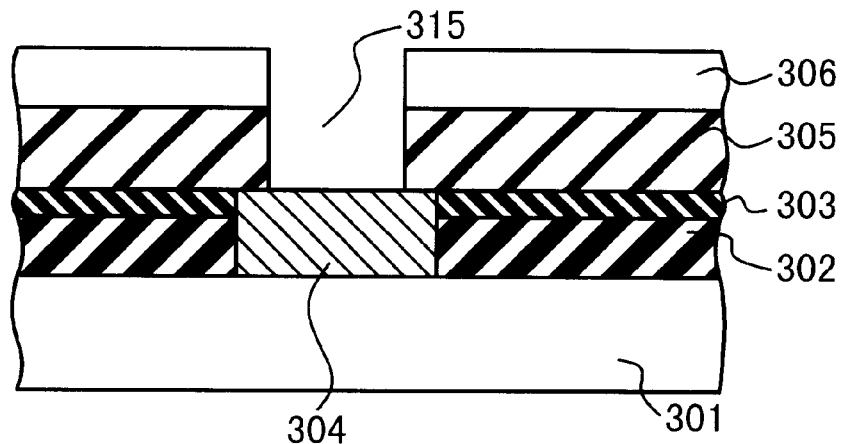
FIGS. 1A to 1C are section views to explain the conventional method for manufacturing the semiconductor device.
Figure 1B:
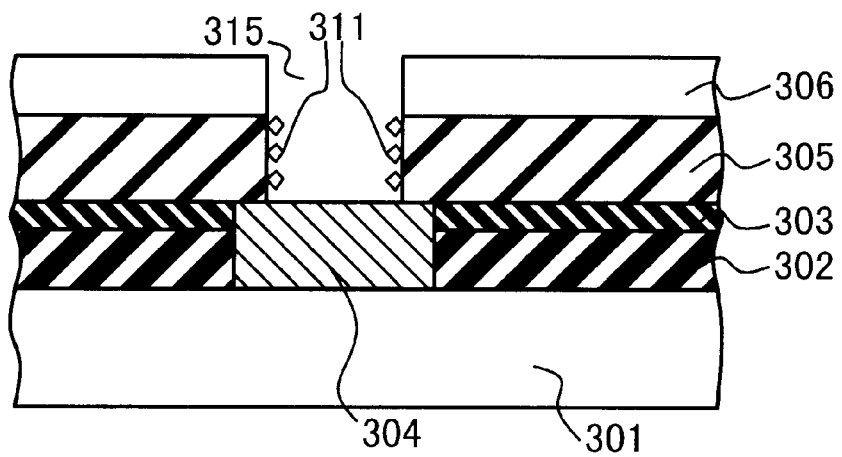
Figure 1C:
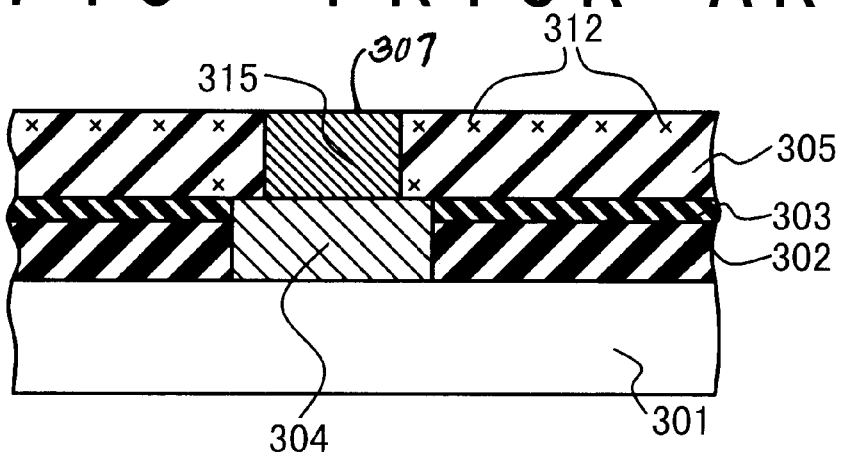

Referring now to drawings, semiconductor devices and methods of manufacturing the semiconductor devices will be described.

At first, a semiconductor device and a method of manufacturing the semiconductor device according to a first embodiment of the present invention will be described below.

According to a first embodiment of the present invention, a semiconductor device and a method of manufacturing the semiconductor device have a feature of forming a plug in a low dielectric constant film. This low dielectric constant film is an interlayer insulating film formed between an upper layer wiring line (pattern) and a lower-layer wiring line (pattern) which are formed in a semiconductor device. This plug is used to electrically connect the upper layer wiring line to the lower-layer wiring line. Here, a low dielectric constant film has a less conductivity than one of a silicon oxide film and a silicon nitride film.

FIG. 2A, FIG. 2B, FIG. 2C, FIG. 2D, FIG. 2E, and FIG. 2F are section views for representing manufacturing steps of the semiconductor device manufacturing method according to a first embodiment of the present invention.

Referring now to FIGS. 2A through 2F, a description will be made of the method for manufacturing the semiconductor device according to the first embodiment of the present invention.

First, a silicon oxide film 102 functioning as an insulating film is formed on a semiconductor substrate 101. This silicon oxide film 102 may be made of not only a silicon oxide, but also at least one of other insulating materials according to the first embodiment of the present invention.

Next, a silicon nitride film 103 is formed on this silicon oxide film 102.

Subsequently, an opening portion such as at least one groove (trench) is formed in this silicon oxide film 102 and the silicon nitride film 103. Here, this opening portion may be formed through this silicon oxide film 102 and the silicon nitride film 103 to the semiconductor substrate 101. Then, a metal material such as aluminum is buried or embedded into this opening portion to form an under-layer aluminum wiring line (pattern) 104 in this opening portion according to the first embodiment of the present invention. Here, the metal material may be adopted as each one of copper, gold, and tungsten according to the first embodiment of the present invention.

Next, an HSQ (hydrogen silsesqioxane) film 105 is formed as a low dielectric constant film on both the silicon oxide film 103 and the lower-layer aluminum wiring line 104. In this first embodiment, the film thickness of this HSQ film 105 is selected to be substantially 800 nm (nanometers). Also, the HSQ film 105 has a smaller dielectric constant value than the insulating film made of silicon nitride or silicon oxide which is conventionally used. As a result, the HSQ film 105 may be employed as the low dielectric constant film to reduce a capacitance of a capacitor existing between the wiring lines. These wiring lines are formed under/over this low dielectric constant film. As other low dielectric constant film, there are inorganic SOG (spin on glass) films and organic SOG films, which may represent low dielectric constant. The below-mentioned low dielectric constant films may be employed as the above-explained HSQ film (low dielectric constant film) 105 in the first embodiment of this invention: a xerogel film which is corresponding to the inorganic SOG film; a HOSP (hydrogen organo siloxane polymer) film, a MSQ (methyl silsesquixane) film, and a PTFE (poly-tetra-fluoroethylene) film which are corresponding to the SOG film made of an inorganic material and an organic material; a FLARE (fluorinated poly-aryl-ether) film, a poly-para-xylylene film, and a BCB (benzo cyclobutene) film which are corresponding to the SOG film made of organic polymer; and a SILK (silicon low K polymer) film which is corresponding to the organic SOG film.

Next, another silicon nitride film 106 is formed on the HSQ film 105. In this first embodiment of this invention, the film thickness of this silicon nitride film 106 is selected to be substantially 250 nm.

Then, a resist mask 107 is formed on the silicon nitride film 106 and then a resist opening portion 117 is formed at a predetermined place in the resist mask 107.

Next, a dry etching treatment is selectively carried out with respect to the silicon nitride film 106 by using the resist mask 107 to form a nitride film opening portion 116. In this first embodiment of this invention, a diameter of this nitride film opening portion 116 is selected to be substantially 0.25 micrometer.

Figure 2A:
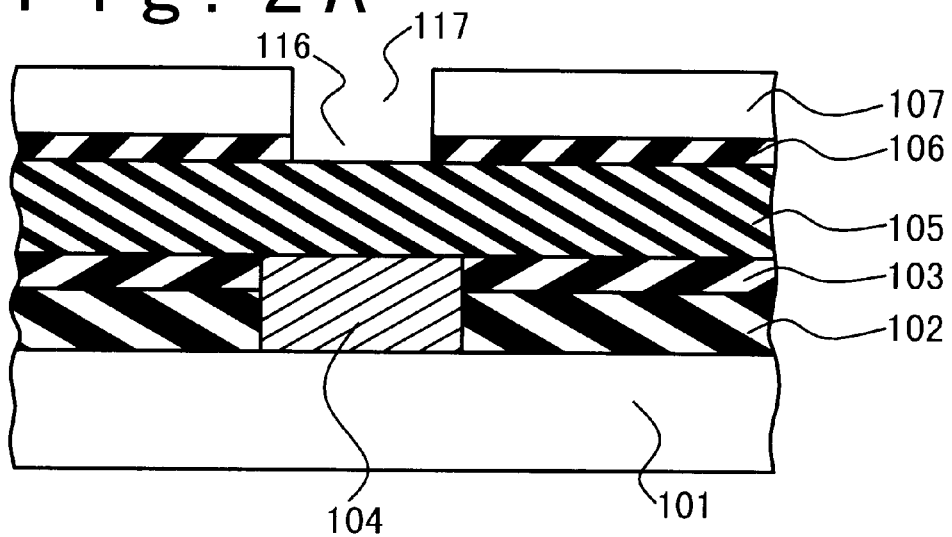
FIGS. 2A to 2F are section views to explain a semiconductor device manufacturing method according to a first embodiment of the present invention.

When the above-described manufacturing steps are carried out, a semiconductor structure shown in the section view of FIG. 2A is obtained in accordance with the method for manufacturing the semiconductor device of the first embodiment of the present invention.

Next, the resist mask 107 is removed by an oxygen plasma treatment.

Figure 2B:
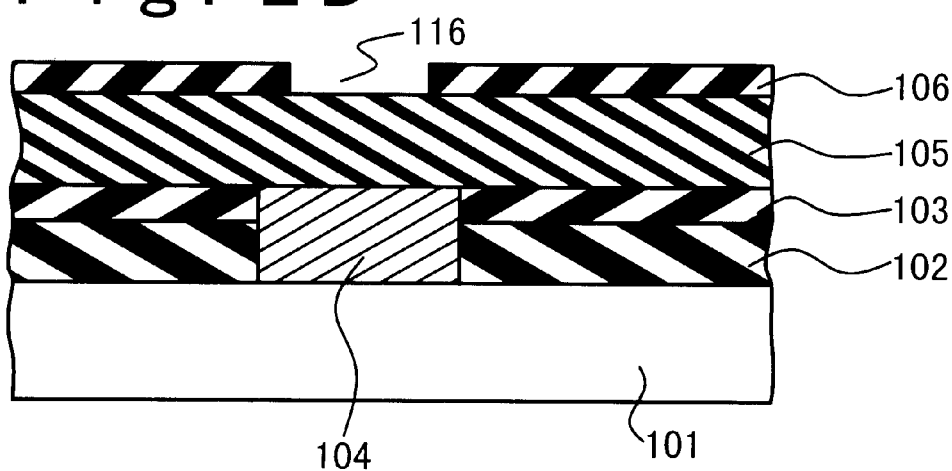

When the above-described manufacturing steps are carried out, a semiconductor structure shown in the section view of FIG. 2B is obtained in accordance with the method for manufacturing the semiconductor device of the first embodiment of the present invention.

Thereafter, while the silicon nitride film 106 in which the nitride film opening portion 116 has been formed is used as a mask, the dry etching treatment is performed with respect to the HSQ film 105. As a result, an interlayer film opening portion 115 is formed in this HSQ film 105.

The etching gas used in the above-described dry etching treatment is equivalent to gas used in a silicon oxide film etching treatment. Concretely speaking, this etching gas is made of carbon/fluorine mixed gas. Moreover, this etching gas may be alternatively mixed with hydrogen gas and/or argon gas.

In this above-described dry etching treatment, the silicon nitride film 106 is also etched away. At this time, the etching speed for the silicon nitride film 106 is lower than or equal to the 1/10 time of the etching speed for the HSQ film 105. Consequently, the silicon nitride film 106 may function as the mask for the HSQ film 105 in this dry etching treatment when the thickness of the silicon nitride film 106 is more than 1/10 time as thick as the thickness of the HSQ film 105.

The above-described dry etching treatment is controlled to expose the under-layer aluminum wiring line 104 which is not substantially damaged by the above-described dry etching treatment at the bottom portion of the interlayer film opening portion 115. Otherwise, the above-described dry etching treatment is controlled to accomplish just before the under-layer aluminum wiring line 104 is exposed at the bottom portion of the interlayer film opening portion 115.

Figure 2C:
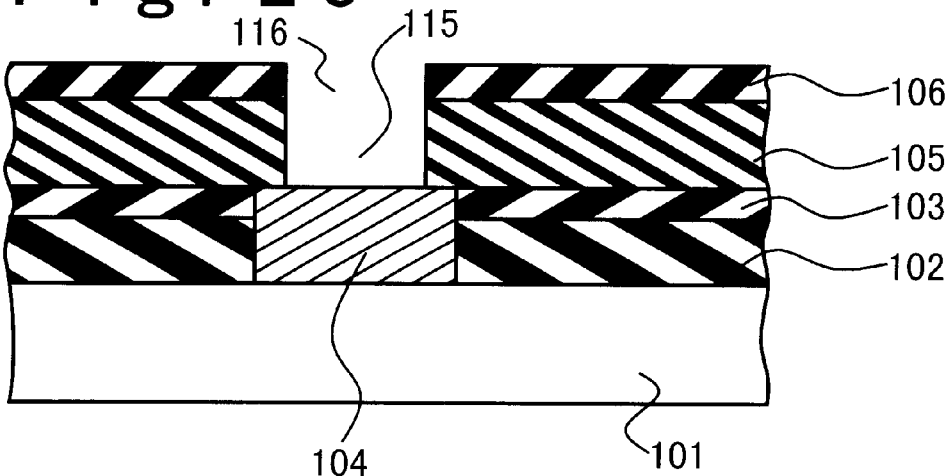

When the above-described manufacturing steps are carried out, a semiconductor structure shown in the section view of FIG. 2C is obtained in accordance with the method for manufacturing the semiconductor device of the first embodiment of the present invention.

Next, a silicon oxide film 108 is formed by way of the plasma CVD (chemical vapor deposition) method to cover both the surface of the silicon nitride film 106 and the inner surface of the interlayer film opening portion 115. Thus, this silicon oxide film 108 may have a function capable of preventing the HSQ film 105 from being exposed toward the side of the interlayer film opening portion 115. The film thickness of this silicon oxide film 108 is preferably selected to be approximately 30 to 40 nm. When the film thickness of the silicon oxide film 108 is made as approximately 30 to 40 nm, the low dielectric constant characteristics owned by the HSQ film 105 may be satisfactorily reflected to the interlayer capacitance. In other words, the dielectric constant characteristics of a layer composed of the silicon oxide film 108 and the HSQ film 105 is nearly equal to that of the HSQ film 105.

Figure 2D:
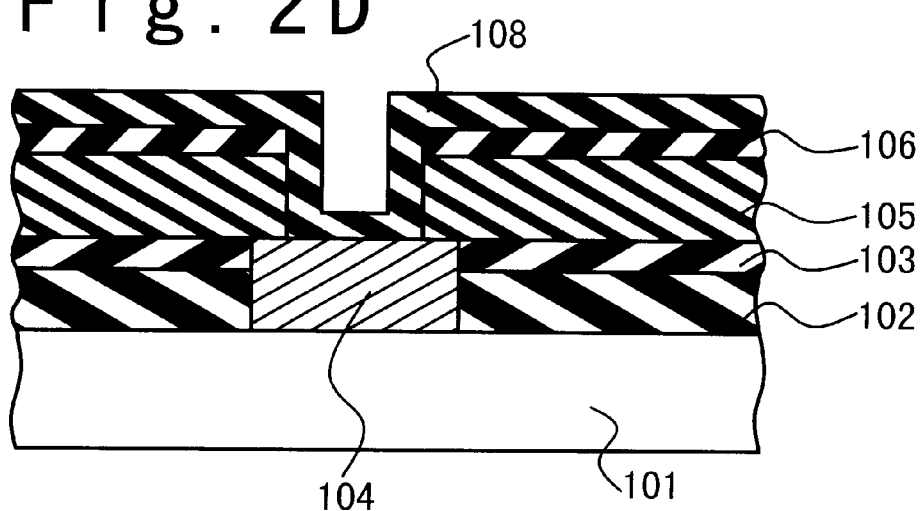

When the above-described manufacturing steps are carried out, a semiconductor structure shown in the section view of FIG. 2D is obtained in accordance with the method for manufacturing the semiconductor device of the first embodiment of the present invention.

Next, entire semiconductor structure is etched anisotropically from the upper direction under the condition where the entire semiconductor structure is covered on the silicon oxide film 108. At this time, entire semiconductor structure is etched anisotropically from the upper direction to expose sufficiently the under layer aluminum wiring line 104 located at the under-layer of the interlayer film opening portion 115.

The entire semiconductor structure is performed by this anisotropic etching treatment under above-described over-etching condition to remove substantially completely both the silicon oxide film 108 formed on the bottom portion of the interlayer film opening portion 115 and the silicon oxide film 108 formed on the silicon nitride film 106. The deposited articles 121 made of aluminum compound are deposited on the silicon oxide film 108 formed on the inner side surface of the interlayer film opening portion 115. The deposited articles 121 are mainly produced by reacting metal aluminum with an etching gas. In this case that carbon/fluorine mixed gas is employed as the etching gas, the deposited articles 121 are mainly made of aluminum fluoride. Similarly, deposited article mainly made of copper fluoride or tungsten fluoride are produced when copper or tungsten is employed as a metal material of the lower layer aluminum wiring line 104.

Figure 2E:
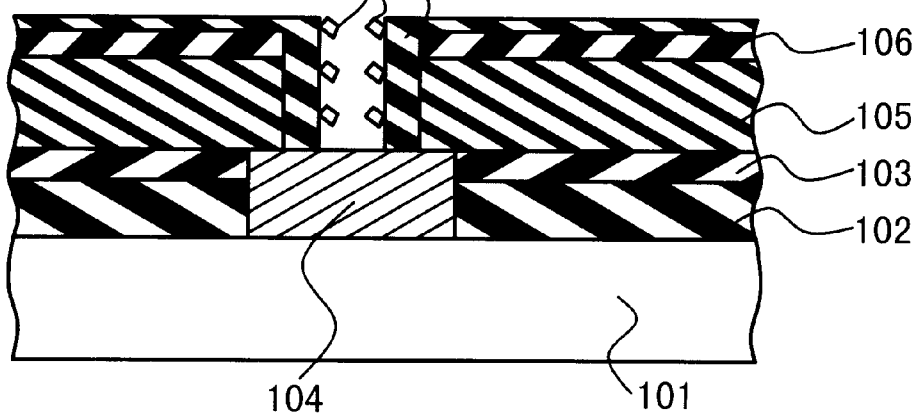

When the above-described manufacturing steps are carried out, such a semiconductor structure as shown in the sectional view of FIG. 2E is obtained in accordance with the method for manufacturing the semiconductor device of the first embodiment of the present invention.

Next, the deposited articles 121 are removed by executing the removing process operation with employment of an organic solvent. These deposited articles 121 are deposited on the silicon oxide film 108 formed on the inner side surface of the interlayer film opening portion 115. The organic solvent used in this first embodiment contains amine solvents and the like by which the deposited articles 121 can be melted to be removed away. As an example of this organic solvent, the following organic solvent materials may be employed: hydroxylamine, mono-ethanolamine, and N-methyl ethanolamine. Also, in such a case that the under-layer aluminum wiring line 104 is replaced by a metal wiring line (pattern) formed by embedding either copper or tungsten as a metal material, the deposited articles 121 may be removed by cleaning the semiconductor structure with employment of the above-pointed organic solvent.

Next, a conductive material such as copper is embedded into the interlayer film opening portion 115 from which the deposited articles 121 have been removed. Furthermore, the surface of the semiconductor element is flatted to form a plug 109. Alternatively, other materials having high conductivity may be used as this conductive material. As an example of this conductive material, aluminum, tungsten, and the like may be employed.

Figure 2F:
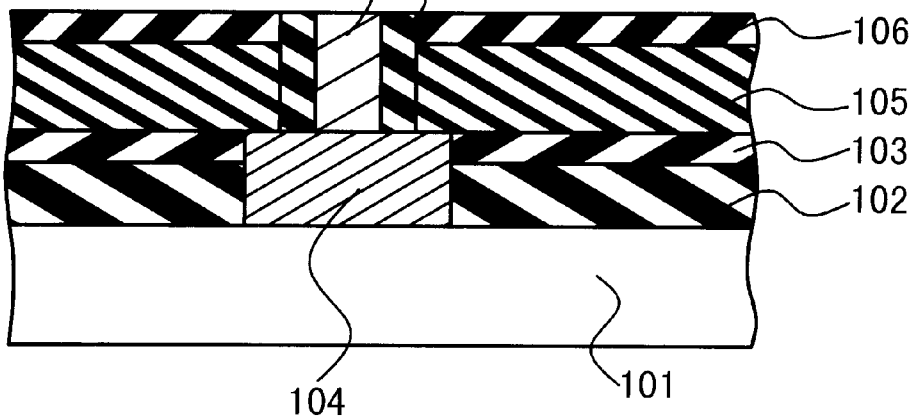

When the above-described manufacturing steps are carried out, a semiconductor structure shown in the section view of FIG. 2F is obtained in accordance with the method for manufacturing the semiconductor device of the first embodiment of the present invention.

In the semiconductor device obtained by the above-explained manufacturing method, the silicon nitride film 103 located on the lower layer of the HSQ film 105 may function as an etching stopper with respect to the silicon oxide film 102 located on the lower layer of the silicon nitride film 103. As a result, when the silicon nitride film 103 other than the under-layer aluminum wiring line 104 is contained at the bottom portion of this interlayer film opening portion 115, the silicon nitride film 103 may prevent the silicon oxide film 102 of the under layer from being etched away on the step of removing sufficiently the silicon oxide film 108 at the bottom of the interlayer film opening portion 115.

In particular, when a semiconductor portion other than the under-layer aluminum wiring line 104 is exposed from a portion of the lower portion of the interlayer film opening portion 115 caused by misalignment, this silicon nitride film 103 may effectively function as the etching stopper with respect to the silicon oxide film 102.

Furthermore, the silicon nitride film 106 located on the upper layer of the HSQ film 105 may function as the etching stopper with respect to the HSQ film 105 in the etching step of forming at least one groove or hole in a wiring pattern layer on the silicon nitride film 106.

As previously described, the method for manufacturing the semiconductor device of the first embodiment of this invention is featured as follows. When the resist mask 107 is stripped by using the oxygen plasma, the HSQ film 105 is exposed to the oxygen plasma atmosphere only at the opening portion 116 where the silicon nitride film 106 is etched. Also, the HSQ film 105 located on the bottom surface of the opening portion 116, which is exposed to the oxygen plasma atmosphere, is removed at the post manufacturing step. As a consequence, the HSQ film 105 corresponding to the low dielectric constant film is not substantially deteriorated during the manufacturing steps where the above-explained oxygen plasma is used.

Also, the method for manufacturing the semiconductor device of the first embodiment of this invention is featured as follows. When the interlayer film opening portion 115 is formed, this manufacturing method is composed of a set of steps. The etching step is a step of forming the interlayer film opening portion 115 is stopped before/after the under-layer aluminum wiring line is exposed. The next step is a step of forming the silicon oxide film 108 to cover the entire semiconductor structure. And the third step is a step of etching the entire semiconductor structure by way of the anisotropic etching treatment to form the interlayer film opening portion 115. In the above-explained third step for performing the anisotropic etching treatment, the bottom portion of the interlayer film opening portion 115 is etched under over-etching condition and the under-layer aluminum wiring line 104 may be sufficiently exposed. Since such an over-etching treatment is carried out, the deposited articles 121 made of aluminum compound are produced. In the step for removing the deposited articles 121 by employment of the organic solvent, this organic solvent under use is not directly made contact with the HSQ film 105 by way of this silicon oxide film 108. As a consequence, the HSQ film 105 functioning as the low dielectric constant film of the first semiconductor device is not substantially deteriorated by the above-described manufacturing step for removing the deposited articles 121 with employment of the organic solvent.

Next, a semiconductor device and a method of manufacturing the semiconductor device according to a second embodiment of the present invention will be described below.

According to a second embodiment of the present invention, a semiconductor device and a method of manufacturing the semiconductor device have a feature of forming a wiring groove (trench) in a low dielectric constant film, and this wiring groove is employed in Damascine method.

FIG. 3A, FIG. 3B, FIG. 3C, FIG. 3D, FIG. 3E, and FIG. 3F are section views for representing manufacturing steps of the semiconductor device manufacturing method according to a second embodiment of the present invention.

Referring now to FIG. 3A through FIG. 3F, a description will be made of the method for manufacturing the semiconductor device according to the second embodiment of the present invention.

First, a silicon oxide film 202 functioning as an insulating film is formed on a semiconductor substrate 201. This silicon oxide film 202 may be made of not only a silicon oxide, but also at least one of other insulating materials according to the first embodiment of the present invention.

Next, a silicon nitride film 203 is formed on this silicon oxide film 202.

Subsequently, an opening portion such as al least one hole is formed in this silicon oxide film 202 and the silicon nitride film 203. Here, this opening portion may be formed through this silicon oxide film 202 and the silicon nitride film 203 to the semiconductor substrate 201. Then, a metal material such as tungsten is buried or embedded into this opening portion to form an under-layer tungsten plug 204 in this opening portion according to the second embodiment of the present invention. Here, the metal material may be adopted as each one of copper, gold, and aluminum according to the second embodiment of the present invention.

Although not shown in the drawing, an intermediate wiring line (pattern) layer may be provided between the semiconductor substrate 201 and an insulating layer composed of the silicon oxide film 202 and the silicon nitride film 203. In this alternative case, the above-described opening portion may be formed through the silicon oxide film 202 and the silicon nitride film 203 to this intermediate wiring line layer.

A low dielectric constant film 205 is formed while covering an entire semiconductor structure. In this second embodiment of this invention, this low dielectric constant film 205 has a smaller dielectric constant value than the insulating film made of silicon nitride or silicon oxide which is conventionally used. As a result, the low dielectric constant film 205 may be employed as the low dielectric constant film to reduce a capacitance of a capacitor existing between the wiring lines. These wiring lines are formed under/over this low dielectric constant film. The low dielectric constant film 205 employed in the second embodiment of this invention may be employed as the above-explained low dielectric constant film 105 in the first embodiment of this invention. The below-mentioned low dielectric constant films may be employed as the low dielectric constant film 205 in the second embodiment of this invention: a HSQ film and a xerogel film which is corresponding to the inorganic SOG film; a HOSP (hydrogen organo siloxane polymer) film, a MSQ (methyl silsesquixane) film, and a PTFE (poly-tetra-fluoroethylene) film which are corresponding to the SOG film made of an inorganic material and an organic material; a FLARE (fluorinated poly-aryl-ether) film, a poly-para-xylylene film, and a BCB (benzo cyclobutene) film which are corresponding to the SOG film made of organic polymer; and a SILK (silicon low K polymer) film which is corresponding to the organic SOG film.

Next, another silicon nitride film 206 is formed on the low dielectric constant film 205.

Then, a resist mask 207 is formed on the silicon nitride film 206 and then a resist opening portion is formed at a predetermined place in the resist mask 207.

Next, a dry etching treatment is selectively carried out with respect to the silicon nitride film 206 by using the resist mask 207 to form a nitride film opening portion 216.

Figure 3A:
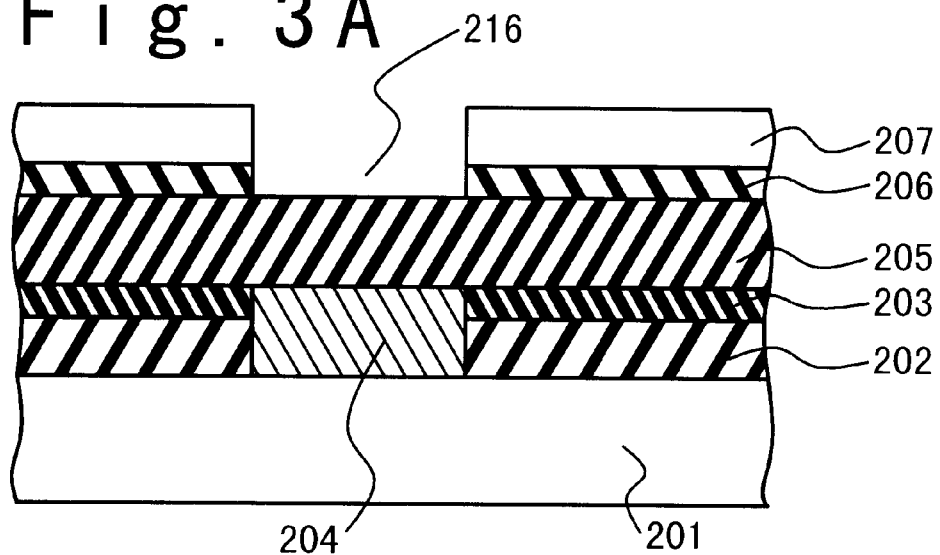
FIGS. 3A to 3F are section views to explain a semiconductor device manufacturing method according to a first embodiment of the present invention.

When the above-described manufacturing steps are carried out, a semiconductor structure shown in the section view of FIG. 3A is obtained in accordance with the method for manufacturing the semiconductor device of the second embodiment of the present invention.

Next, the resist mask 207 is removed by using oxygen plasma.

Figure 3B:
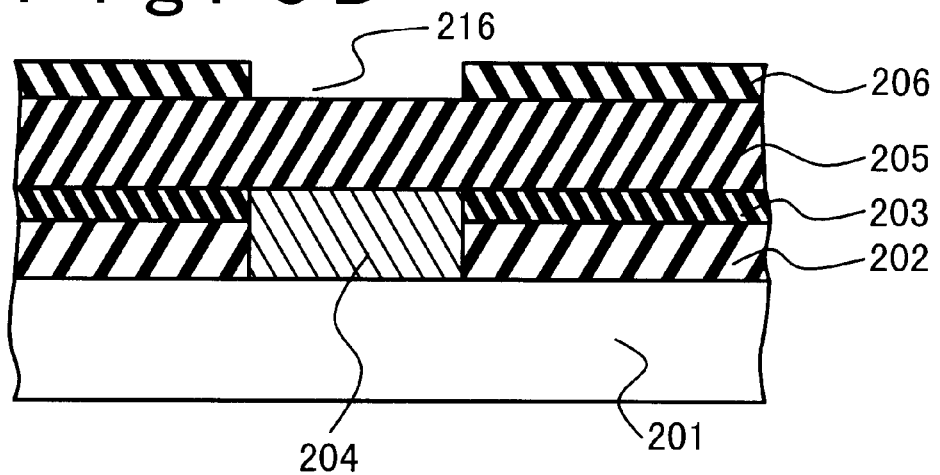

When the above-described manufacturing step is carried out, a semiconductor structure shown in the section view of FIG. 3b is obtained in accordance with the method for manufacturing the semiconductor device of the second embodiment of the present invention.

Thereafter, while the silicon nitride film 106 in which the nitride film opening portion 216 has been formed is used as a mask, the dry etching treatment is performed with respect to the low dielectric constant film 205. As a result, an interlayer film opening portion 215 is formed in this low dielectric constant film 205.

The etching gas used in the above-described dry etching treatment is equivalent to gas used in a silicon oxide film etching treatment. Concretely speaking, this etching gas is made of carbon/fluorine mixed gas. Moreover, this etching gas may be alternatively mixed with hydrogen gas and/or argon gas.

In this above-described dry etching treatment, the silicon nitride film 206 is also etched away. At this time, the etching speed for the silicon nitride film 206 is lower than or equal to the 1/10 time of the etching speed for the low dielectric constant film 205. As a result, the silicon nitride film 206 may function as the mask for the low dielectric constant film in this dry etching treatment when the thickness of the silicon nitride film 206 is more than 1/10 time as thick as the thickness of the low dielectric constant film 205.

The above-described dry etching treatment is controlled to expose the under-layer tungsten plug 204 which is not substantially damaged by the above-described dry etching treatment at the bottom portion of the interlayer film opening portion 215. Otherwise, the above-described dry etching treatment is controlled to accomplish just before the under-layer tungsten plug 204 is exposed at the bottom portion of the interlayer film opening portion 215.

Figure 3C:
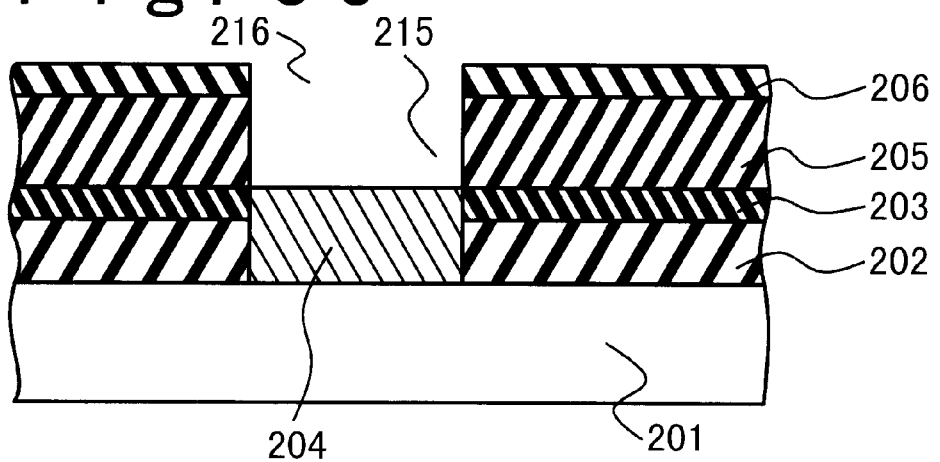

When the above-described manufacturing steps are carried out, a semiconductor structure shown in the section view of FIG. 3C is obtained in accordance with the method for manufacturing the semiconductor device of the first embodiment of the present invention.

Next, an oxide film 208 such as a silicon oxide film is formed by way of the plasma CVD (chemical vapor deposition) method to cover both the surface of the silicon nitride film 206 and the inner surface of the interlayer film opening portion 215. Thus, this silicon oxide film 208 may have a function capable of preventing the low dielectric constant film 205 from being exposed toward the side of the interlayer film opening portion 215. The film thickness of this oxide film 208 is preferably selected to be approximately 30 to 40 nm. When the film thickness of the oxide film 208 is made as approximately 30 to 40 nm, the low dielectric constant characteristic owned by the low dielectric constant film 205 may be satisfactorily reflected to the interlayer capacitance. In other words, the dielectric constant characteristics of a layer composed of the silicon oxide film 208 and the low dielectric constant film 205 is nearly equal to that of the the low dielectric constant film.

Figure 3D:
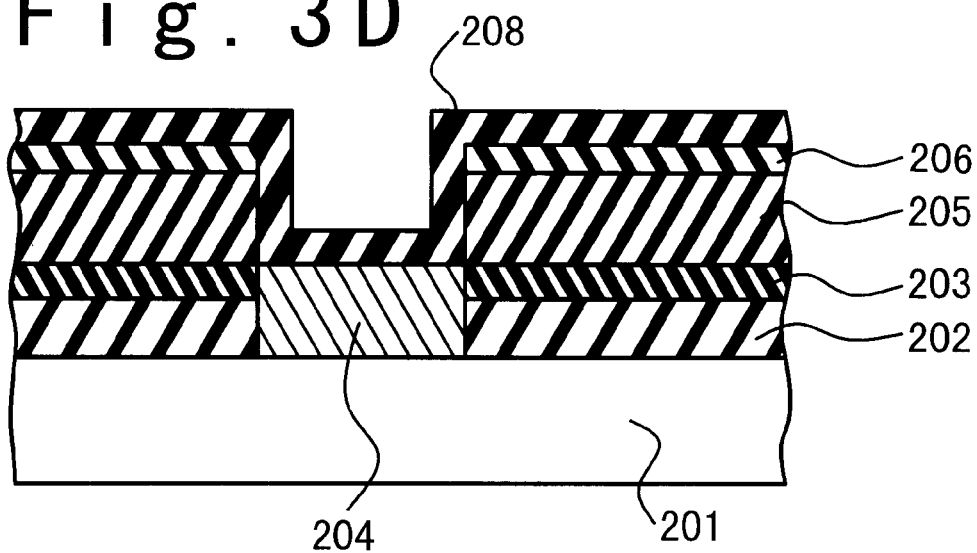

When the above-described manufacturing steps are carried out, a semiconductor structure shown in the section view of FIG. 3D is obtained in accordance with the method for manufacturing the semiconductor device of the second embodiment of the present invention.

Next, the entire semiconductor structure is etched anisotropically from the upper direction under the condition where the entire semiconductor structure is covered on the silicon oxide film 208. At this time, entire semiconductor structure is etched anisotropically from the upper direction to expose sufficiently the under-layer tungsten plug 204 located at the under-layer of the interlayer film opening portion 215.

The entire semiconductor structure is performed by this anisotropic etching treatment under above-described over-etching condition to remove substantially completely both the silicon oxide film 108 formed on the bottom portion of the interlayer film opening portion 115 and the silicon oxide film 108 formed on the silicon nitride film 106. The deposited articles 221 made of tungsten compound are deposited on the oxide film 208 formed on the inner side surface of the interlayer film opening portion 215. The deposited articles 221 are mainly produced by reacting metal tungsten with etching gas. In this case that carbon/fluorine mixed gas is employed as the etching gas, the deposited articles 221 are mainly made of tungsten fluoride. Similarly, deposited article mainly made of copper fluoride or aluminum fluoride are produced when copper or aluminum is employed as a metal material of the lower layer aluminum wiring line 104.

Figure 3E:
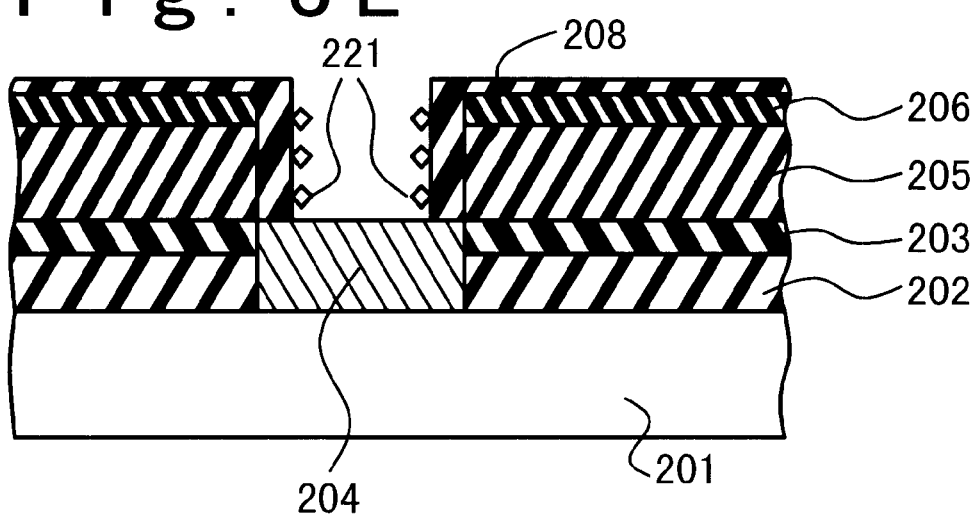

When the above-described manufacturing steps are carried out, a semiconductor structure shown in the section view of FIG. 3E is obtained in accordance with the method for manufacturing the semiconductor device of the second embodiment of the present invention.

Next, the deposited articles 221 are removed by executing the removing process operation with employment of an organic solvent. These deposited articles 221 are deposited on the oxide film 208 formed on the inner side surface of the interlayer film opening portion 215. The organic solvent used in this second embodiment contains amine solvents and the like by which the deposited articles 221 can be melted to be removed away. As an example of this organic solvent, the following organic solvent materials may be employed: hydroxylamine, mono-ethanolamine, and N-methyl ethanolamine. Also, in such a case that the tungsten plug 204 is replaced by plug formed by embedding either copper or aluminum as a metal material, the deposited articles 221 may be removed by cleaning the semiconductor structure with employment of the above-pointed organic solvent.

Next, a copper wiring line 209 connected to the under-layer tungsten plug 204 is formed by embedding copper into the interlayer film opening portion 115 from which the deposited articles 221 have been removed. As an example of this conductive material of a copper wiring line 209, aluminum, tungsten, and the like may be employed.

Figure 3F:
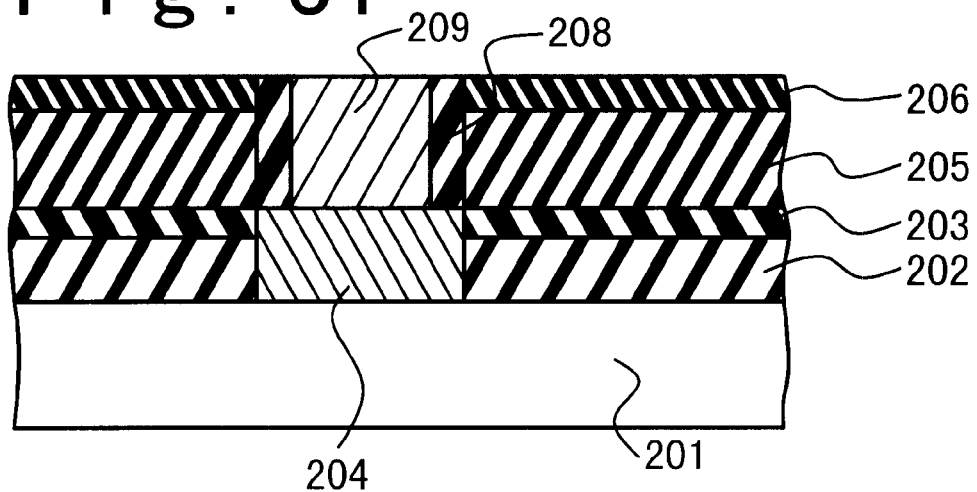

When the above-described manufacturing steps are carried out, a semiconductor structure shown in the section view of FIG. 3F is obtained in accordance with the method for manufacturing the semiconductor device of the second embodiment of the present invention.

In the semiconductor device obtained by the above-explained manufacturing method, the silicon nitride film 203 located on the lower layer of low dielectric constant film 205 may function as an etching stopper with respect to the silicon oxide film 202 located on the lower layer of the silicon nitride film 203. As a result, when the silicon nitride film 203 other than the under-layer tungsten plug 204 is contained at the bottom portion of this interlayer film opening portion 215, the silicon nitride film 203 may prevent the silicon oxide film 202 of the under layer from being etched away on the step of removing sufficiently the oxide film 208 at the bottom of the interlayer film opening portion 215.

In particular, when a semiconductor portion other than the under-layer tungsten plug 204 is exposed from a portion of the lower portion of the interlayer film opening portion 215 caused by misalignment, this silicon nitride film 203 may effectively function as the etching stopper with respect to the silicon oxide film 202.

Furthermore, the silicon nitride film 206 located on the upper layer of the low dielectric constant film 205 may function as the etching stopper with respect to the low dielectric constant film 205 in the etching step of forming at least one groove or hole in a wiring pattern layer on the silicon nitride film 206.

The second embodiment of the present invention can achieve a similar advantage to that of the first embodiment of the present invention.

As previously described, the method for manufacturing the semiconductor device of the second embodiment of this invention is featured as follows. When the resist mask 207 is stripped by using the oxygen plasma, the low dielectric constant film 205 is exposed to the oxygen plasma atmosphere only at the nitride film opening portion 216 where the silicon nitride film 206 is etched. Also, the low dielectric constant film 205 located on the bottom surface of the nitride film opening portion 216, which is exposed to the oxygen plasma atmosphere, is removed at the post manufacturing step. As a consequence, the low dielectric constant film 205 is not substantially deteriorated during the manufacturing steps where the above-explained oxygen plasma is used.

Also, the method for manufacturing the semiconductor device of the second embodiment of this invention is featured as follows. When the interlayer film opening portion 215 is formed, this manufacturing method is composed of a set of steps. The etching step is a step of forming the interlayer film opening portion 215 is stopped before/after the under-layer tungsten plug 204 is exposed. The next step is a step of forming the oxide film 208 to cover the entire semiconductor structure. And the third step is a step of etching the entire semiconductor structure by way of the anisotropic etching treatment to form the interlayer film opening portion 215. In the third step for performing the anisotropic etching treatment, the bottom portion of the interlayer film opening portion 215 is etched under over-etching condition and the under-layer tungsten plug 204 may be sufficiently exposed. Since such an over-etching treatment is carried out, the deposited articles 221 made of tungsten compound are produced. In the step for removing the deposited articles 221 by employment of the organic solvent, this organic solvent under use is not directly made contact with the low dielectric constant film 205 by way of this oxide film 208. As a consequence, the low dielectric constant film 205 is not substantially deteriorated by the above-described manufacturing step for removing the deposited articles 221 with employment of the organic solvent.

As previously described, in the semiconductor devices and the methods for manufacturing the semiconductor devices of the present invention, the deterioration occurred in the characteristics of the formed low dielectric constant film can be reduced, or prevented. As a result, the capacitance produced in the interlayer of the wiring lines or patterns can be lowered, and also the resulting semiconductor devices can be operated in high speeds. Furthermore, it is possible to suppress the amount of water components contained in the low dielectric constant films. Under such a circumstance, it is also possible to suppress the current leak amount as well as the corrosion of either the formed plug or the formed wiring line in the semiconductor devices. As a result, the semiconductor devices and the semiconductor device manufacturing method of the present invention can increase the reliability of the resultant semiconductor device, and furthermore can stabilize the circuit performance.

What is claimed is:

1. A method of manufacturing a semiconductor device comprising
   (a) forming a dielectric constant film made of hydrogen silesquioxane on a wiring line layer formed on a substrate, wherein said dielectric constant film has a smaller dielectric constant value than those of a silicon oxide film and silicon nitride film;
   (b) forming an upper protection film made of silicon nitride on said dielectric constant film;
   (c) forming a resist mask on the upper protection film;
   (d) selectively etching the upper protection film to form an opening using the resist mask;
   (e) removing the resist mask;
   (f) forming an opening through said dielectric constant film to said wiring line layer by selectively etching said dielectric constant film, wherein said upper protection film functions as an etching mask;
   (g) forming a side protection film on all sides of said dielectric constant film exposed at said opening portion, wherein the side protection film is an oxide; and
   (h) burying an electrically conductive material into said opening portion to form a conductor buried portion, and carrying out over-etching under conditions such that the wiring layer is sufficiently exposed;
   wherein said forming an opening portion further comprises:
      controlling an etching amount to said dielectric constant film such that said wiring line layer is not reacted with etching gas, and
   wherein said forming a side protection film comprises:
      forming a covering oxide film covering an entire semiconductor structure containing said opening portion; and
      anisotropically etching said covering oxide film to said wiring line layer located at a lower portion of said opening portion until said wiring line layer is exposed.

2. A method of manufacturing a semiconductor device according to claim 1, wherein an uppermost layer of said wiring layer includes an insulating portion made of a silicon nitride film, and an electrically conductive portion made of electrically conductive materials, at least a part of said electrically conductive portion is exposed at a bottom of said opening portion before said burying an electrically conductive material, and
   wherein said forming said side protection film further comprises:
      removing a reacted article produced by reacting with said exposed wiring line layer and said etching gas used in said anisotropically etching said covering oxide film before said burying an electrically conductive material.

3. A method of manufacturing a semiconductor device according to claim 2, wherein said removing said reacted article includes cleaning said opening portion with organic solvent.

4. A method of manufacturing a semiconductor device according to claim 3, wherein said organic solvent contains amine.

5. A method of manufacturing a semiconductor device according to claim 3, wherein said organic solvent contains material selected from the group consisting of hydroxylamine, mono-ethanolamine, and N-methyle ethanolamine.

6. A method of manufacturing a semiconductor device according to claim 1, wherein said forming said covering oxide film includes forming a silicon oxide film by a CVD (chemical vapor deposition) method to cover an entire semiconductor structure containing said opening portion.

7. A method of manufacturing a semiconductor device according to claim 1, wherein a film thickness of said covering oxide film is substantially 30 to 40 nm.

8. A method of manufacturing a semiconductor device according to claim 1 wherein said conductor buried portion is made of material selected form the group consisting of tungsten, aluminum, and copper.

9. A method of manufacturing a semiconductor device according to claim 1 wherein said electrically conductive portion is made of material selected from the group consisting of tungsten, aluminum, and copper.

10. A method of manufacturing a semiconductor device according to claim 1 wherein said forming an opening portion includes said selectively etching said dielectric constant film with an etching gas, and said etching gas is made of material selected from the group consisting of carbon/fluorine mixed gas, carbon/fluorine-mixture-gas mixed with hydrogen gas, carbon/fluorine-mixture-gas mixed with argon gas, and carbon/fluorine-mixture gas mixed with both hydrogen gas and argon gas.

11. A method of manufacturing a semiconductor device according to claim 1 wherein a film thickness of said upper protection film is thicker than a $1/10$ film thickness of said dielectric constant film.

* * * * *